(12) United States Patent
Greer et al.

(10) Patent No.: US 11,890,640 B2
(45) Date of Patent: Feb. 6, 2024

(54) MONOLAYER DEPOSITION OF NANOPARTICLES

(71) Applicant: NanoClear Technologies, Inc., Pasadena, CA (US)

(72) Inventors: Harold Frank Greer, Los Angeles, CA (US); Rehan Kapadia, Los Angeles, CA (US); Angelica Saenz, Pasadena, CA (US); David Webber, Los Angeles, CA (US)

(73) Assignee: Nanoclear Technologies, Inc., Pasadena, CA (US)

( * ) Notice: Subject to any disclaimer, the term of this patent is extended or adjusted under 35 U.S.C. 154(b) by 0 days.

(21) Appl. No.: 17/794,429

(22) PCT Filed: Jan. 21, 2021

(86) PCT No.: PCT/US2021/014368
§ 371 (c)(1),
(2) Date: Jul. 21, 2022

(87) PCT Pub. No.: WO2021/150720
PCT Pub. Date: Jul. 29, 2021

(65) Prior Publication Data
US 2023/0095274 A1 Mar. 30, 2023

Related U.S. Application Data

(60) Provisional application No. 62/963,589, filed on Jan. 21, 2020.

(51) Int. Cl.
*B05D 1/18* (2006.01)
*C09D 7/40* (2018.01)
(Continued)

(52) U.S. Cl.
CPC ............... *B05D 1/185* (2013.01); *B05D 3/12* (2013.01); *B05D 7/54* (2013.01); *C09D 7/66* (2018.01)

(58) Field of Classification Search
CPC ............ B05D 1/185; B05D 3/12; B05D 7/54
See application file for complete search history.

(56) References Cited

U.S. PATENT DOCUMENTS

| 10,017,384 B1 | 7/2018 | Greer et al. |
| 10,319,898 B2 | 6/2019 | Shealy |

(Continued)

FOREIGN PATENT DOCUMENTS

| JP | 2010-001555 A | 1/2010 |
| KR | 10-2020-0029084 A | 3/2020 |
| WO | 2021150720 A1 | 7/2021 |

OTHER PUBLICATIONS

PCT/US2021/014368 received an International Search Report and Written Opinion, dated Apr. 28, 2021, 15 pages.

*Primary Examiner* — Hai Y Zhang
(74) *Attorney, Agent, or Firm* — Kilpatrick Townsend & Stockton LLP

(57) ABSTRACT

Methods of forming a monolayer of nanoparticles are described. The method may include forming an activated surface on a substrate. Methods may also include contacting the activated surface with a fluid including nanoparticles. Methods may further include forming a plurality of monolayers in the liquid on the activated surface. The plurality of nanoparticles may include a first monolayer of nanoparticles bonded to the activated surface. The plurality of nanoparticles may include a second monolayer of nanoparticles bonded to the first monolayer of nanoparticles. The bond strengths between a nanoparticle and the underlying substrate, between adjacent nanoparticles, and between nanoparticles of adjacent monolayers may be related by a (Continued)

specific relationship. The method may also include removing monolayers of the plurality of monolayers while retaining the first monolayer to form the substrate with the first monolayer. Systems for performing the methods and substrates resulting from the methods are also described.

20 Claims, 16 Drawing Sheets

(51) Int. Cl.
    *B05D 3/12*     (2006.01)
    *B05D 7/00*     (2006.01)

(56) References Cited

U.S. PATENT DOCUMENTS

| | | |
|---|---|---|
| 2006/0099430 A1 | 5/2006 | Subramanya et al. |
| 2008/0102201 A1 | 5/2008 | Choi et al. |
| 2011/0014473 A1 | 1/2011 | Ying et al. |
| 2014/0079884 A1 | 3/2014 | Krogman et al. |
| 2016/0136685 A1 | 5/2016 | Ettrich et al. |
| 2018/0198006 A1* | 7/2018 | Greer ............... H10K 71/12 |
| 2019/0074389 A1 | 3/2019 | Greer et al. |
| 2020/0025981 A1 | 1/2020 | Greer et al. |

* cited by examiner

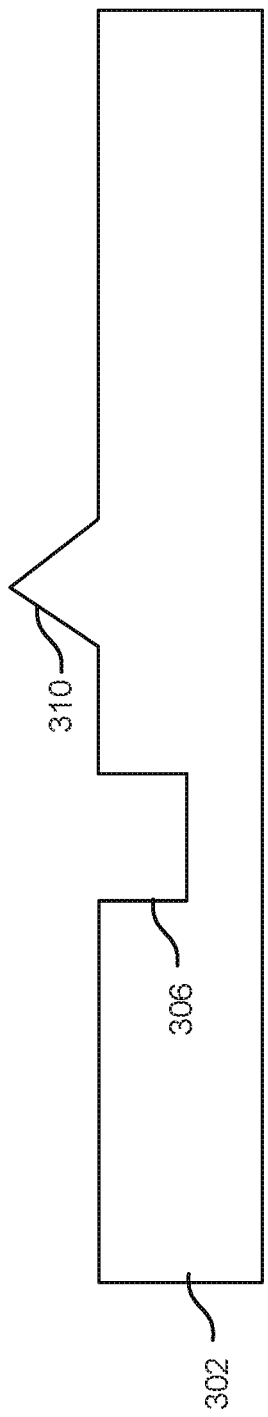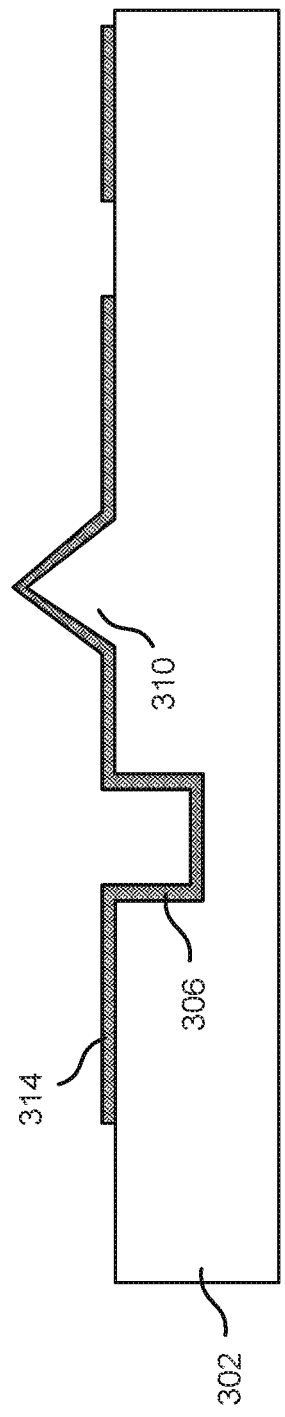

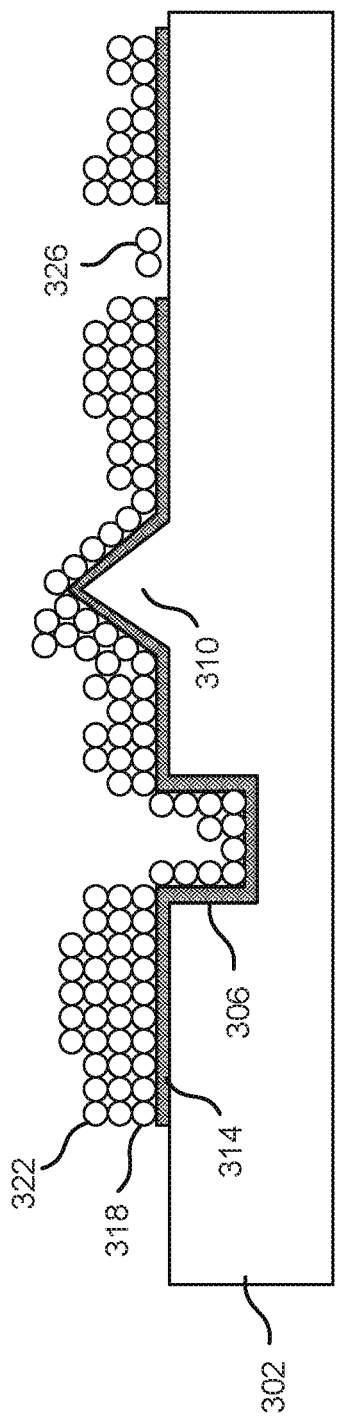
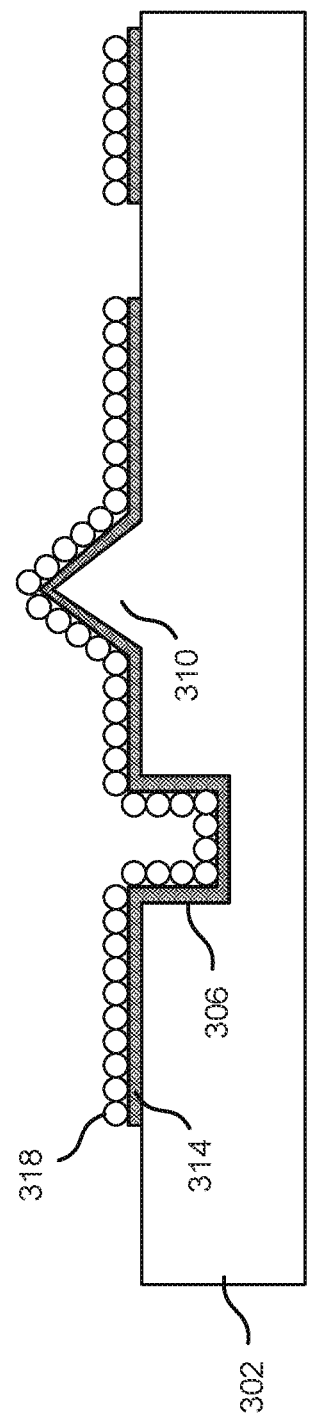

MONOLAYER DEPOSITION OF NANOPARTICLES

CROSS-REFERENCE TO RELATED APPLICATION

This application claims the benefit of priority to U.S. Provisional Application No. 62/963,589, filed Jan. 21, 2020, the entire contents of which are incorporated herein by reference for all purposes.

BACKGROUND

Several existing products may include coatings and other types of surface modifications to obtain particular physical, chemical, optical, or electrical properties for the product surface. For example, modification of surface properties may be achieved by the deposition of nanoparticles on the surface by a non-bonding process. These nanoparticles may be applied to the surface by a spin, spray, or dip coating process. Nanoparticles may be attached to surfaces for a variety of reasons. While these techniques are effective in certain applications, they nevertheless may present some drawbacks, mainly due to the fact that these techniques do not robustly attach or associate the nanoparticles to the surface. Many of these known techniques also do not have specificity, require extreme care during deposition, and do not generally attach a single layer of nanoparticles uniformly on a surface. Additionally, these processes may not be able to effectively apply a single layer of nanoparticles onto curved, structured, three-dimensional, or other non-uniform surfaces. Furthermore, certain processes may not result in a close packed distribution of nanoparticles in a single layer or offer the ability to tailor the spacing between such particles. In addition, such processes cannot control the distribution of nanoparticles or spacing between such nanoparticles in two, three, or more layers. Accordingly, processes and systems that provide improvements to applying nanoparticles to surfaces are desired. These and other improvements are discussed herein.

BRIEF SUMMARY

Embodiments of the present invention include forming a single monolayer of nanoparticles on a substrate using a fluid media. The single monolayer of nanoparticles formed may be close packed, where the nanoparticles are in contact with each other and/or are bonded to each other. Embodiments of the present invention may achieve a close packed arrangement of nanoparticles through using a combination of materials and processes within certain parameters. Additional embodiments can allow for a regular spacing between particles.

The bond strengths between the nanoparticles within the same monolayer and across different monolayers and between the nanoparticle and the substrate may have a certain relationship. The bond strength between the nanoparticle and the substrate allow for nanoparticles to be sufficiently mobile to form a close packed arrangement without detaching from the substrate. Monolayers above the first monolayer may be removed by processes that do not remove nanoparticles in the first monolayer.

Embodiments of the present invention may include a method of forming a monolayer of nanoparticles. The method may include forming an activated surface on a substrate. Methods may also include contacting the activated surface with a fluid including nanoparticles. Methods may further include forming a plurality of monolayers in the liquid on the activated surface. The plurality of nanoparticles may include a first monolayer of nanoparticles bonded to the activated surface. The plurality of nanoparticles may include a second monolayer of nanoparticles bonded to the first monolayer of nanoparticles. The bond strengths between a nanoparticle and the underlying substrate, between adjacent nanoparticles, and between nanoparticles of adjacent monolayers may be related by a specific relationship. The method may also include removing monolayers of the plurality of monolayers while retaining the first monolayer to form the substrate with the first monolayer, where each nanoparticle in the first monolayer is bonded to another nanoparticle in the first monolayer.

Embodiments of the present invention may include a coated substrate. The coated substrate may include the substrate, an adhesion promoter overlaying the substrate, a fluid, and a plurality of monolayers of nanoparticles in the fluid on the adhesion promoter. The plurality of monolayers of nanoparticles may include a first monolayer of nanoparticles bonded to the adhesion promoter and a second monolayer of nanoparticles bonded to the first monolayer of nanoparticles. The bond strengths between a nanoparticle and the underlying substrate, between adjacent nanoparticles, and between nanoparticles of adjacent monolayers may be related by a specific relationship.

Embodiments of the present invention may include a coated substrate. The coated substrate may include a substrate, an adhesion promoter, and a single monolayer of nanoparticles on the adhesion promoter. The bond strengths between a nanoparticle and the underlying substrate and between adjacent nanoparticles may be related by a specific relationship. The monolayer may have a length greater than 12 inches.

Embodiments of the present invention may include a system for depositing nanoparticles on a substrate. The system may include an activated surface formation chamber, a nanoparticle deposition chamber, and a nanoparticle removal chamber.

A better understanding of the nature and advantages of embodiments of the present invention may be gained with reference to the following detailed description and the accompanying drawings.

BRIEF DESCRIPTION OF THE DRAWINGS

FIGS. 3A, 3B, 3C, and 3D show a process flow of the stages of forming a single monolayer of nanoparticles on a substrate according to embodiments of the present invention.

DETAILED DESCRIPTION

Figure 1A:
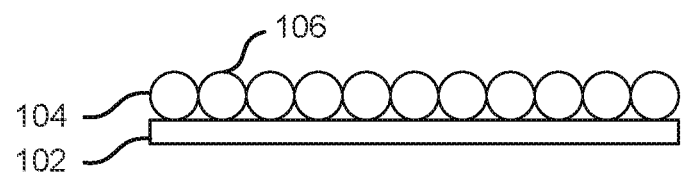
FIG. 1A illustrates a close packed arrangement of nanoparticles in a monolayer according to embodiments of the present invention.

Embodiments of the present invention involve forming a single monolayer of nanoparticles on a substrate using a liquid media. The single monolayer of nanoparticles formed may be close packed. FIG. 1A shows a close packed arrangement. A close packed arrangement refers to nanoparticles being in contact with each other and/or being bonded to each other. Nanoparticle 104 is in contact with nanoparticle 106, both of which are on substrate 102.

Figure 1B:
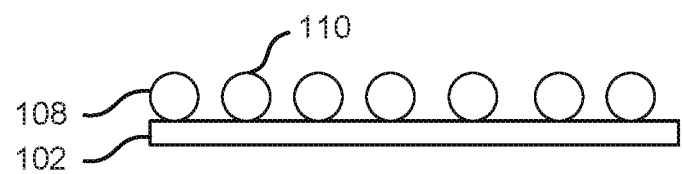
FIG. 1B illustrates a stochastic arrangement of nanoparticles in a monolayer according to embodiments of the present invention.

Embodiments of the present invention may avoid a stochastic arrangement of nanoparticles in a monolayer. FIG. 1B shows a stochastic arrangement. A stochastic arrangement refers to nanoparticles that are not in contact with each other. Adjacent nanoparticles are spaced such that the distance between them is less than or equal to the diameter of the nanoparticle. In the case that the nanoparticles are from a distribution of sizes, the nanoparticles will be placed at a distance less than or equal to the diameter of the largest nanoparticle in the distribution. For example, nanoparticle 108 is spaced from adjacent nanoparticle 110. If the space between adjacent nanoparticles is larger than the diameter of a nanoparticle, then another nanoparticle may fill the space between the adjacent nanoparticles.

A monolayer of nanoparticles may refer to a single layer of nanoparticles. A complete monolayer may be a layer on which no other nanoparticles may adsorb. For example, a close packed monolayer is complete because no other nanoparticles can be added to that monolayer. A stochastic arrangement can also be complete because no other nanoparticles can be added to the stochastic arrangement in the monolayer. A partial or incomplete monolayer may refer to any layer of nanoparticles where additional nanoparticles can be added to the monolayer. For example, a monolayer where a space between two adjacent nanoparticles is larger than the diameter of the nanoparticle is an incomplete or a partial monolayer. The fraction of a complete monolayer may be calculated as the number of nanoparticles present in the monolayer divided by the maximum number of nanoparticles possible in the monolayer (either a close packed or stochastic arrangement). The first monolayer may refer to nanoparticles located at a distance less than or equal to the size of the nanoparticle away from the substrate. The second monolayer may refer to nanoparticles contacting the first monolayer and not contacting the substrate. The second monolayer may be nested within the first monolayer so that the second monolayer is closer than two times the size of the nanoparticles in the first monolayer. The $n^{th}$ monolayer may refer to nanoparticles contacting the particles of the $(n-1)^{th}$ monolayer.

Nanoparticles may be used to provide or improve certain physical, chemical, optical, electrical, thermal, or other properties of an underlying substrate, surface, or structure. For example, a monolayer or controlled layers of nanoparticles may enhance the brightness, contrast, directionality, control of color spectrum, or other optical properties of light emitting diodes (LEDs), including organic LEDs, mini-LEDs, microLEDs, and nanoLEDs. Enhancing the optical properties may result in a more efficient and/or less expensive LED, which may be competitive with other display technologies, including bare organic LEDs (OLEDs). A close packed arrangement of nanoparticles may best provide the desired properties by minimizing the area of the LED that is not covered by a nanoparticle. Hence, a stochastic arrangement of nanoparticles may not be desired.

Forming a close packed arrangement of nanoparticles may involve using nanoparticles, compositions, and processes with specific properties that allow for a close packed monolayer to form. Without specific conditions, a stochastic arrangement may form or multiple layers instead of a single monolayer may form. Systems, methods, and structures are described herein.

The formation of a close packed arrangement may include a certain relationship of bond strengths between nanoparticles and between nanoparticles and the underlying substrate. When the fluid containing particles is first contacted to the surface, a stochastic arrangement of nanoparticles may be formed. However, a close packed arrangement may ultimately form if there is sufficient mobility in the nanoparticles attached or associated to the substrate. The nanoparticles may be attached directly to the substrate or may be attached indirectly to the substrate through an adhesion promoter. The nanoparticles may also be associated through hydrogen bonding process, charged species, polymeric entanglement, surface roughness capturing, or any combination thereof. A nanoparticle that is sufficiently mobile may move toward an adjacent nanoparticle. In addition, some nanoparticles may be associated together in solution without forming random agglomerates, which may precipitate out of solution. At a close enough distance, the two neighboring nanoparticles on the surface may bond or associate to each other. The bonding between neighboring nanoparticles may not be a chemical bond and may instead be a result of van der Waals, coulombic, entanglement, or hydrogen bonding forces. The bond may be an association between two entities or may describe a potential energy minimum between two entities.

Figure 2:
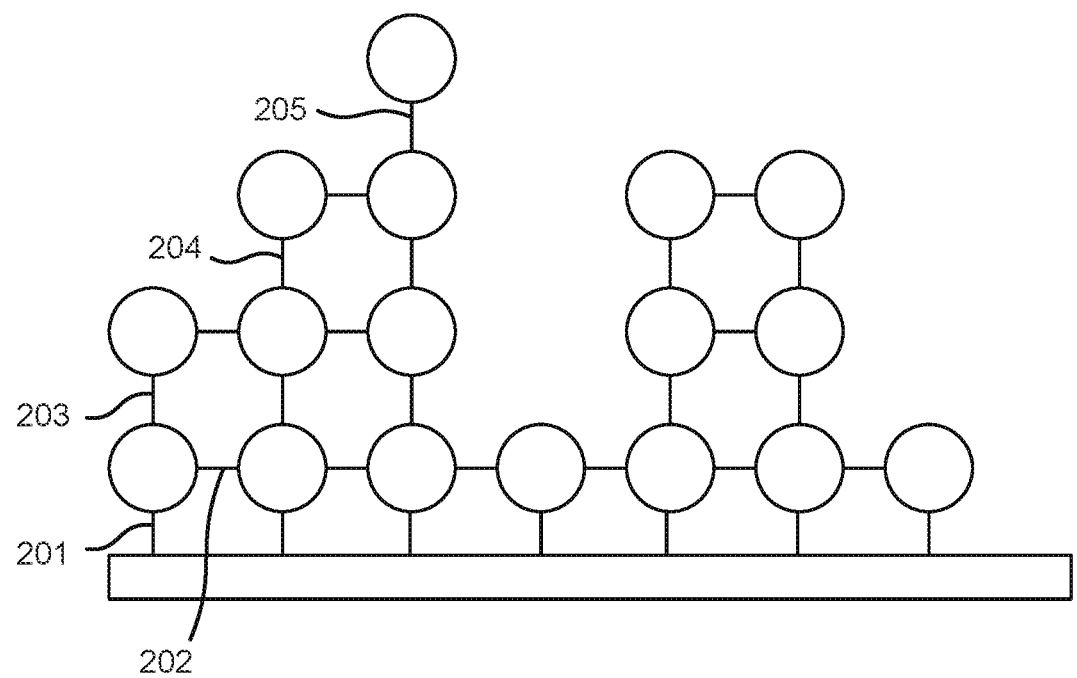
FIG. 2 shows bonding with the substrate and nanoparticles in different monolayers according to embodiments of the present invention.

FIG. 2 illustrates the bonding between nanoparticles for explanatory purposes. Bond 201 is the bond between a nanoparticle of the first monolayer and the substrate. Bond 202 is the bond between two adjacent nanoparticles of the first monolayer. Bond 203 is the bond between a nanoparticle of the second monolayer and the adjacent nanoparticle of the first monolayer. Bond 204 is the bond between a nanoparticle of the third monolayer and the adjacent nanoparticle of the second monolayer. Bond 205 is the bond between a nanoparticle of the fourth monolayer and the adjacent nanoparticle of the third monolayer. Fewer or more monolayers are possible than what is illustrated. The bonds shown in FIG. 2 may or may not be covalent chemical bonds. In some embodiments, the bonds may result from contact between nanoparticles and/or the substrate. In some embodiments, the illustrated bonds may be an association between nanoparticles and/or the substrate.

The bond strength between the nanoparticle and the underlying substrate (bond 201) may be below a threshold value (hundreds [100, 200, 300, 400, 500, 600, 700, 800, or 900] of kJ/mole for a covalent bond, for example). The bond strength may be in a range from 0.25 kJ/mol to 500 kJ/mol. The threshold value may be a value at which the nanoparticle does not move under operating conditions. If the bond strengths of the nanoparticles and the underlying substrate is above the threshold value, then the nanoparticles would not move laterally along the substrate, and a stochastic or closest approach arrangement may be formed. It is also possible that the mobility of a grouping of particles within the first monolayer on the surface can become less mobile than individual particles. That leads to the formation of islands that ultimately coalesce and merge with others to form a complete monolayer.

The bond strength between adjacent nanoparticles of the first monolayer (bond 202) on the surface may be less than the bond strength between the nanoparticle and the underlying substrate. The bond strength between the nanoparticle and the underlying substrate (bond 201) being greater than a bond strength between nanoparticles may allow for the nanoparticle to stay attached to the substrate. If the bond strength between two nanoparticles of the first monolayer (bond 202) is stronger than the strength of the bond with the underlying substrate, then the nanoparticles may detach from the substrate while remaining attached to each other. Nanoparticles may then agglomerate and/or precipitate in the liquid.

The bond strength between adjacent nanoparticles of the first monolayer (bond 202) may be greater than the strength of a bond between a nanoparticle of the first monolayer and an adjacent nanoparticle of a second monolayer (bond 203). The second monolayer may be on top of the first monolayer. The bond strength between adjacent nanoparticles of the first monolayer (bond 202) may be slightly greater than the strength of a bond between a nanoparticle of the first monolayer and an adjacent nanoparticle of a second monolayer (bond 203). Slightly greater may include a strength that is 5% or less, 5% to 10%, 10% to 15%, 15% to 20%, 20% to 25%, or 25% to 50% greater than a comparable strength. The bond strength between nanoparticles of the first monolayer and the second monolayer (bond 203) should be less than the strength of adjacent nanoparticles in the first monolayer (bond 202) so that the second monolayer can be removed from the first monolayer without separating many or any nanoparticles in the first monolayer from an adjacent monolayer.

The bond strengths between nanoparticles of a monolayer above the first monolayer and adjacent subsequent overlying layers (e.g., bond 204, bond 205) may be less than the bond strength between nanoparticles of the first monolayer and the second monolayer (bond 203). With this relationship, then monolayers at the third monolayer and above may not readily form and/or may easily be removed without impacting the first monolayer. These bond strengths at the third monolayer and above with the overlying layer (e.g., bond 204, bond 205) may be from 0% to 10%, 10% to 20%, 20% to 30%, 30% to 40%, or 40% to 50% of the bond strength between nanoparticles of the first monolayer and the second monolayer (bond 203).

The relationship of the bond strengths may be as follows:

Bond 201>Bond 202>Bond 203>>Bond 204, Bond 205.

These bond strengths refer to strengths while in a liquid medium. When the nanoparticles are dry, the bond strengths of bond 202, bond 203, bond 204, and/or bond 205 may become approximately equal.

To achieve these bond strengths, certain combinations of adhesion promoters and nanoparticles may be used. An adhesion promoter may bond between the substrate and the first monolayer. The adhesion promoter can take many forms such as a single surface functional group, a small molecule, a self-assembled monolayer with an attractive head and tail group, a long chained polymer, surface roughness of a characteristic diameter which may be comparable to the size of the nanoparticle. Certain methods and systems may be used to deposit and remove nanoparticles. Details of the adhesion promoter, nanoparticles, structures, methods, and systems are described in greater detail below. The bond strengths may also be affected by pH, additives, nanoparticle concentration in a fluid, properties of the fluid. These parameters may be varied in order to achieve the desired bond strength relationship.

I. PROCESS

The process to form a substrate with a single monolayer of nanoparticles using wet chemistry may involve operations leveraging the bond strength differences described above.

A. Overview of Process Flow

FIGS. 3A, 3B, 3C, and 3D illustrate stages of forming a monolayer of nanoparticles. FIG. 3A shows a substrate 302. Substrate 302 to be coated with a monolayer of nanoparticles may be include a semiconductor wafer. Substrate 302 may be patterned to have different structures. The structures may include lines, trenches, ridges, vias, arrays, pyramids, pits, spirals, beams, trusses, and pillars. FIG. 3A shows a trench 306 and a ridge 310. The structures may have a characteristic dimension, length, width, and/or height of from 1 to 50 nm, 50 to 100 nm, 100 to 250 nm, 250 to 500 nm, 500 nm to 1 micron, 1 micron to 5 microns, 5 microns to 10 microns, 10 microns to 20 microns, or more than 20 microns. MicroLED structures can be on the order of 500 nm to 20 microns. Some structures may be hierarchical and have multiple length scales that define them. The structure may extend from a bulk of the substrate (e.g., a ridge). In some embodiments, the structure may be defined by extending into the bulk of the substrate from the outer surface (e.g., a trench). As examples, the structures may include those shown in FIGS. 25-31 of U.S. Pat. No. 10,017,384, issued Jul. 10, 2018, and in FIGS. 25-31 of U.S. Pat. No. 10,319,898, issued Jun. 11, 2019, the entire contents of both of which are incorporated herein by reference for all purposes. The patterned substrate may include a solar cell, an LED, an optical filter, an optical enhancer, or intermediate structures in the formation thereof. They may also include polymeric, naturally derived (e.g., from animal hair pelts), or paper fibers or composites thereof. The structures may be fashioned out of the bulk material of the substrate or from materials that were grown or deposited upon FIG. 3B shows a stage after an adhesion promoter 314 has been deposited or formed on substrate 302. Adhesion promoter 314 may be patterned or deposited in certain areas. Adhesion promoter 314 may be on top of certain structures of the substrate or may exclude being on top of certain structures of the substrate. In FIG. 3B, adhesion promoter 314 is on top of both trench 306 and ridge 310. Adhesion promoter 314 may be deposited conformally or non-conformally over any surface of the substrate. Adhesion promoter 314 may be considered an activated surface.

1. Intermediate Structure

FIG. 3C shows a coated substrate as an intermediate structure in the process. The coated substrate may include substrate 302. Adhesion promoter 314 may overlay substrate 302. A fluid with nanoparticles (e.g., nanoparticle 318) may contact substrate 302 and adhesion promoter 314. The nanoparticles may bond to adhesion promoter 314. A plurality of monolayers of nanoparticles may be bonded to adhesion promoter 314. The plurality of nanoparticles may be disposed in a fluid. Nanoparticle 322 is an example of a nanoparticle in a layer above the first monolayer directly bonded to adhesion promoter 314. In an area without an adhesion promoter, nanoparticles (e.g., nanoparticle 326) may not bond to the substrate.

Adhesion promoter 314 may not be soluble in the fluid and may be applied or formed via gas phase processes such as sputtering, evaporation, CVD, ALD, etching, etc. The liquid or fluid may include ethanol or any alcohol, organic solvent such as hexanes, tetrahydrofuran, dimethylsulfuoxide, amine, base, acid, water, supercritical fluid such as carbon dioxide, or a blended mixture of any of these. Adhesion promoter 314 can take many forms such as a single surface functional group, a small molecule, a self-assembled monolayer with an attractive head and tail group, a long chained polymer, surface roughness of a characteristic diameter which may be comparable to the size of the nanoparticle. Formation or bonding of the adhesion promoter may require vacuum, heating, cooling, plasma treatment, or evaporation.

The first monolayer on top of the adhesion promoter may include nanoparticles contacting adjacent nanoparticles in the first monolayer. The first monolayer may be in a close packed arrangement. The first monolayer may include or exclude nanoparticles that are not in a close packed arrangement. The nanoparticles that are not in a close packed arrangement may be located at the same distance from the substrate as the nanoparticles in the first monolayer that are in a close packed arrangement. Hence, these nanoparticles may still be referred to as being part of the first monolayer.

The nanoparticles may include silica. In some embodiments, the nanoparticles may include an oxide (e.g., titanium dioxide, zirconium oxide, hafnium oxide) or metals such as gold, platinum, copper, and others. The nanoparticles may be coated by silica or other oxides by liquid processes or gas phase processes. The nanoparticles may be contain mixtures of materials such as barium strontium titanate, alumina silcates, titania silicates. The nanoparticles may be hollow or formed from an agglomeration of smaller nanoparticles. The nanoparticles may have a mean average, a median, or a modal diameter from 1 to 10 nm, 10 to 20 nm, 20 to 25 nm, 25 to 30 nm, 30 to 40 nm, 40 to 50 nm, 50 to 60 nm, 60 to 70 nm, 70 to 80 nm, 80 to 90 nm, 90 to 100 nm, 100 to 500 nm, or 500 to 1,000 nm. In some embodiments, the nanoparticles may not be perfectly spherical. The diameter may then refer to the diameter of a spherical particle having the same volume as the non-spherical nanoparticle. In some embodiments, the size of the nanoparticle may be a characteristic dimension of the nanoparticle. The characteristic dimension may be the length, width, or height of a nanoparticle. The characteristic dimension may have a mean average, a median, or modal size in any range described for the diameter. The nanoparticles can be crystalline or amorphous or some combination thereof.

The plurality of monolayers may include a second monolayer of nanoparticles bonded to the first monolayer of nanoparticles. The plurality of monolayers may include three or more monolayers. Each monolayer of the plurality of monolayers above the first monolayer may or may not include only nanoparticles that are close packed. In some embodiments, the specific monolayer associated with a nanoparticle refers to the distance the nanoparticle is from the substrate. For example, a nanoparticle in the third monolayer may be positioned at a distance two monolayers away from the substrate. The nanoparticles in the contacting fluid may be a mixture of particles either in size distribution or material composition or both. In that case, the definition of a monolayer may include smaller nanoparticles packed within the gaps between larger ones.

The bond strengths between the nanoparticles may be as described above. For example, a first bond between a first nanoparticle of the first monolayer and the adhesion promoter may be characterized by a first bond strength. A second bond between two adjacent nanoparticles of the first monolayer may be characterized by a second bond strength. A third bond between the first nanoparticle of the first monolayer and an adjacent nanoparticle of the second monolayer may be characterized by a third bond strength. The first bond strength may be greater than the second bond strength. The second bond strength may be greater than the third bond strength.

The first bond strength may be less than a threshold value. The threshold value may be a bond strength value that prevents mobility of the nanoparticle along the adhesion promoter or substrate.

2. Removal of Nanoparticles

FIG. 3D shows a stage after the monolayers above the first monolayer are removed. The removal of these monolayers may be facilitated by the weaker bond strength of these monolayers with the underlying monolayer, as explained above. As a result, monolayers may be removed without removing the first monolayer. For example, nanoparticle 322 is removed but not nanoparticle 318. Nanoparticle 326, which had no adhesion promoter 314 to bond to, is also removed. FIG. 3D shows a complete monolayer as no additional nanoparticles can bond to the substrate because of the absence of the adhesion promoter in the exposed portions of the substrate.

Various techniques may remove monolayers of nanoparticles. One technique to remove monolayers of nanoparticles may include flowing gas substantially normal to the substrate that is wet with the nanoparticle containing fluid. The force of the gas pushes the fluid away from the substrate, ultimately leaving the surface drier than it was previously. The force of the fluid flow is stronger than the strength of the bonds between two monolayers but weaker than the strength of the bond between the substrate and the first monolayer. The gas may then move the upper monolayers off the substrate. The gas may be delivered through a showerhead or point source and may also create a stagnation point from, or the gas may be delivered along a line and rastered linearly across the face of the substrate.

Figure 4A:
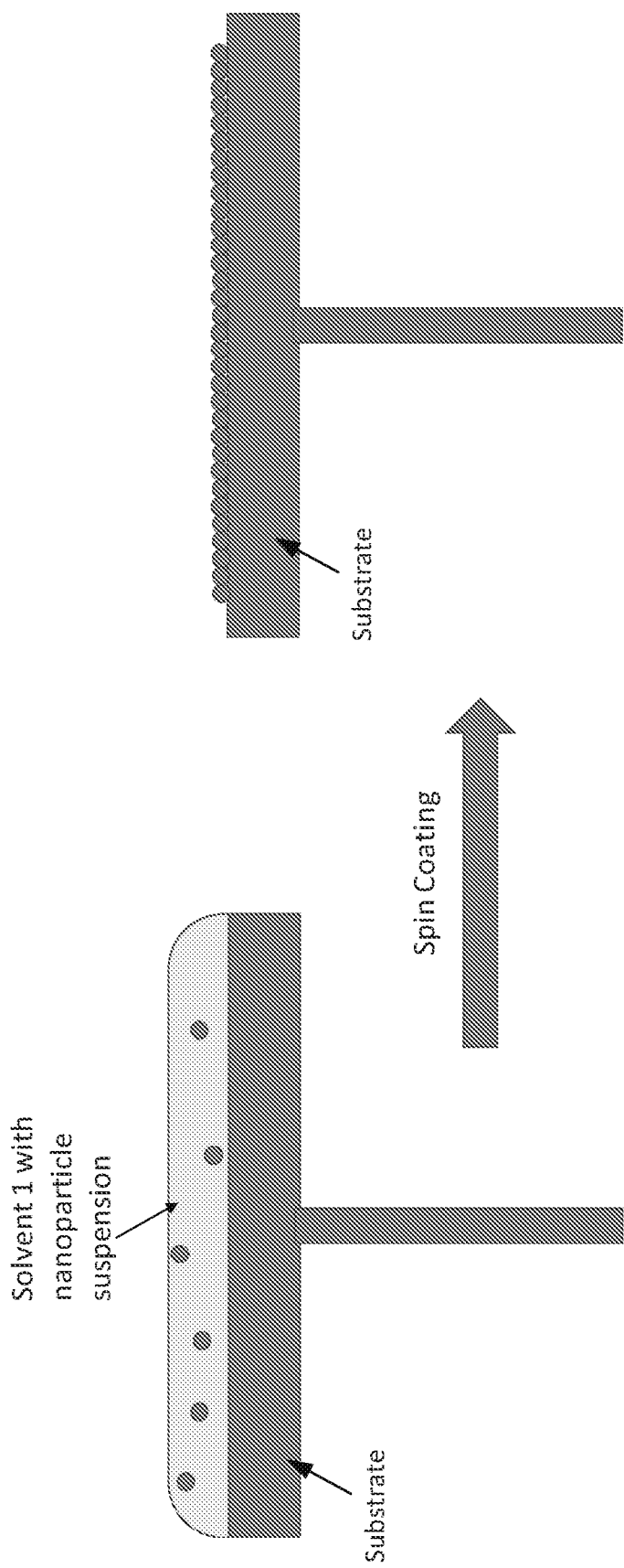
FIGS. 4A, 4B, and 4C shows three exemplary, but not limiting, methods of removing excess nanoparticles and/or ensuring the deposition of the desired number of nanoparticles layers according to embodiments of the present invention. These include blow drying, dipping, or Marangoni coating.

In some embodiments, monolayers may be removed by spinning the substrate. The centripetal force pushes nanoparticles to the edge of the substrate and off the substrate. The centripetal force may be greater than the bond strength between two monolayers but weaker than the bond strength between the substrate and the first monolayer. The monolayers over the first monolayer may then be removed. The spinning of the substrate may be performed by equipment similar to equipment used when spinning on photoresist in the semiconductor industry. FIG. 4A shows a spin coating system. Solvent 1 with a nanoparticle suspension on top of a substrate is shown on the left. The substrate may be spun, leaving a monolayer of nanoparticles, as shown on the right.

Figure 4B:
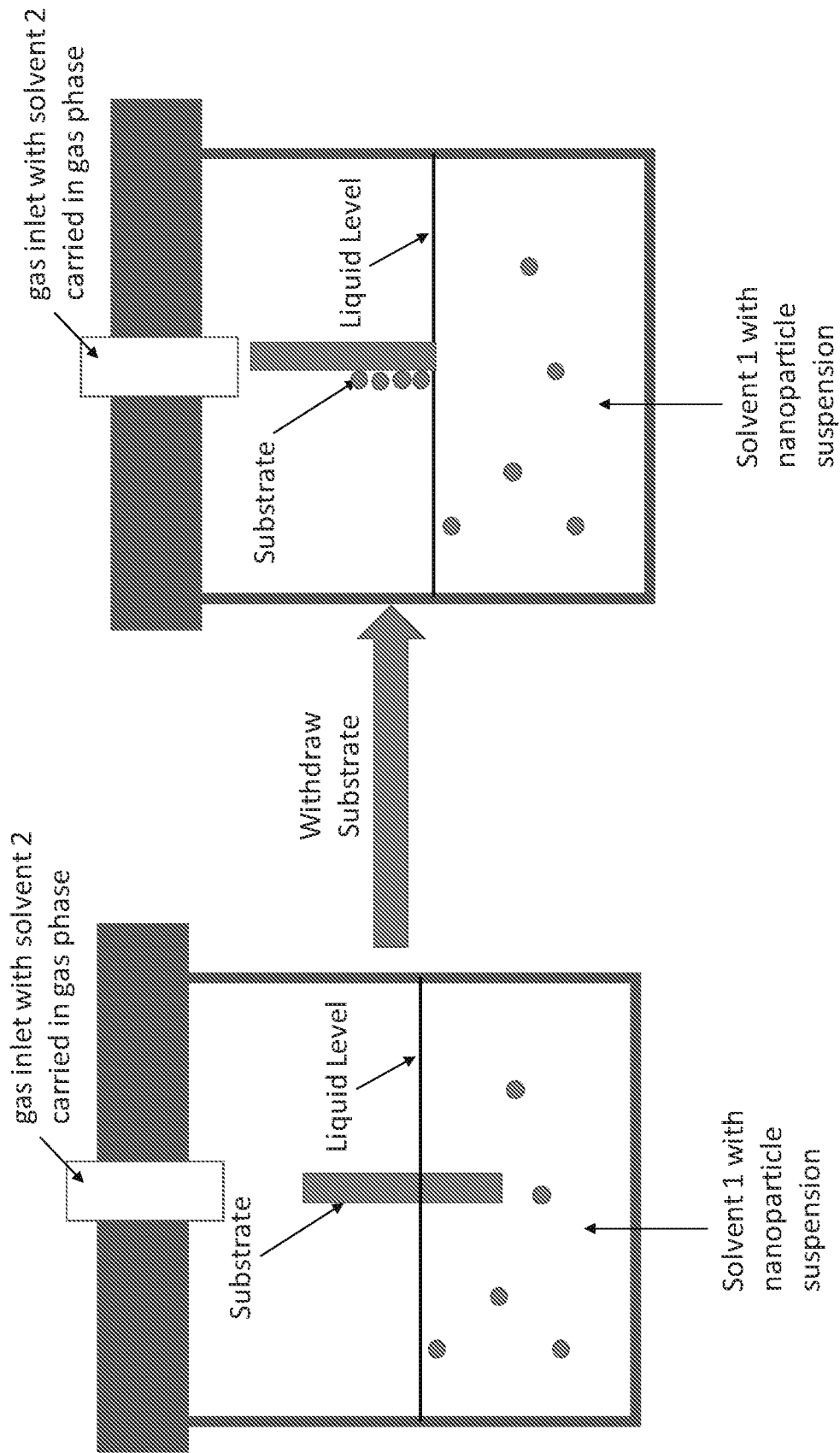
Figure 4C:
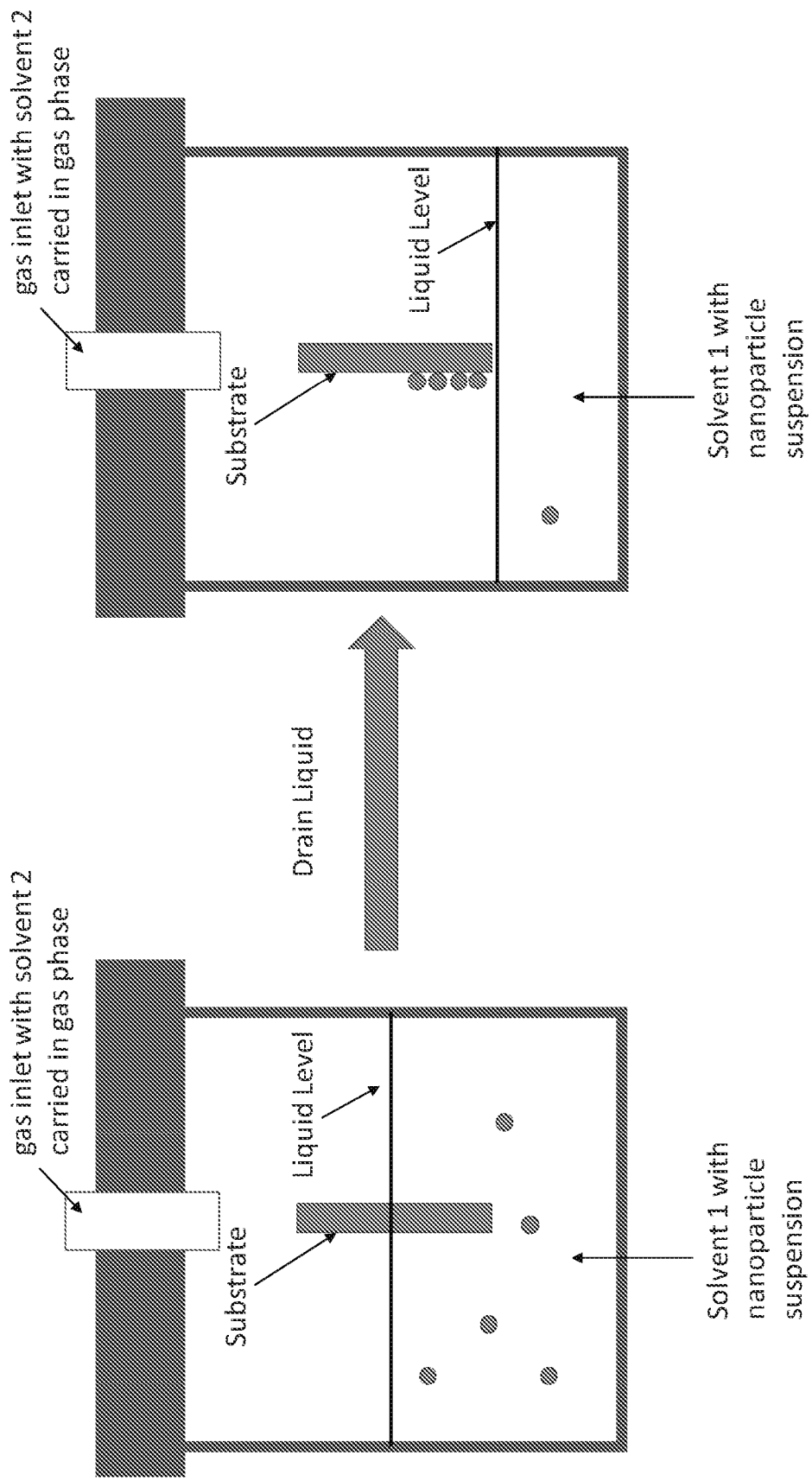

FIG. 4B shows that in some embodiments, monolayers may be removed by pulling the substrate from a liquid bath to form a single monolayer. The force at the liquid-gas interface at the substrate is stronger than the bond strength between two monolayers but weaker than the bond strength between the substrate and the first monolayer due to the presence of the adhesion promoter between the substrate and the first layer of nanoparticles. Pulling the substrate from the liquid bath may then remove the upper monolayers from the first monolayer. The liquid bath may be the same liquid bath used to deposit monolayers on the substrate. As a result, this removal step may simplify the overall process flow. In some embodiments, the liquid bath may be enclosed and the gaseous head space of the enclosed area may have a vapor of a different fluid that the liquid or fluid containing the nanoparticles (as shown on the left of FIG. 4B). The vapor may not be in equilibrium with the nanoparticle containing fluid, which causes the liquid meniscus to experience a force that drives it back into the nanoparticle fluid. That can result in a dry substrate with a monolayer if nanoparticles (as shown on the right of FIG. 4B). The nanoparticle coater described here can also function by draining the nanoparticle fluid from the closed container as shown in FIG. 4C. The net effect is similar as the liquid withdraws along the substrate without requiring the substrate to move.

In some embodiments, nanoparticles in monolayers above the first monolayer may break off from the underlying nanoparticles as the removal of the monolayers above the first monolayer may be favored thermodynamically or kinetically. Removal in this manner may only be practical if not too many monolayers are added above the first monolayer. As a result, this removal technique may be used when the number of nanoparticles is controlled such that there are not sufficient nanoparticles to form a second, third, fourth, or other monolayer. One method for delivering nanoparticles in this near minimized nanoparticle contacting condition is spray coating. Spraying from a suspension that does not dissolve or damage the adhesion promoter can allow the few excess nanoparticles to be removed by dips in a clean solution to allow the excess particles to be removed.

The substrate with the first monolayer may be dry or substantially dry after removing the upper monolayers. In some embodiments, the first monolayer may be dried of liquid through heating, gas flow, or evaporation under ambient conditions. The gas flow may be a wall of gas. In some embodiments, the first monolayer may not be dried through heating or gas flow.

After removing the upper monolayers, only a single monolayer of nanoparticles may remain. The single monolayer of nanoparticles may be close packed, as shown in FIG. 3D. A coated substrate may include a substrate, an adhesion promoter overlaying the substrate, a monolayer of nanoparticles on the adhesion promoter. The monolayer may be characterized by a degree of uniformity above a cutoff value. The monolayer may have a length from 2 to 3 inches, 3 to 4 inches, 4 to 6 inches, 6 to 12 inches, 1 to 2 feet, 2 to 4 feet, or greater than 4 feet. In some embodiments, the monolayer may continuous over the length. In other embodiments, the monolayer may not be continuous over the length but from 50% to 60%, 60% to 70%, 70% to 80%, 80% to 90%, 90% to 95%, or over 95% of the length is covered by the monolayer.

In some embodiments, it may be advantageous to remove or partially remove the adhesion promoter in a gas phase process after the close packed monolayer is achieved. One exemplary reason would be that a polymeric adhesion promoter might partially absorb light from the LED device or may yellow with time exposed to UV light or heat. By removing the layer with an oxygen plasma or ozone, only stable inorganic materials would be left behind.

B. Example Methods

Figure 5:
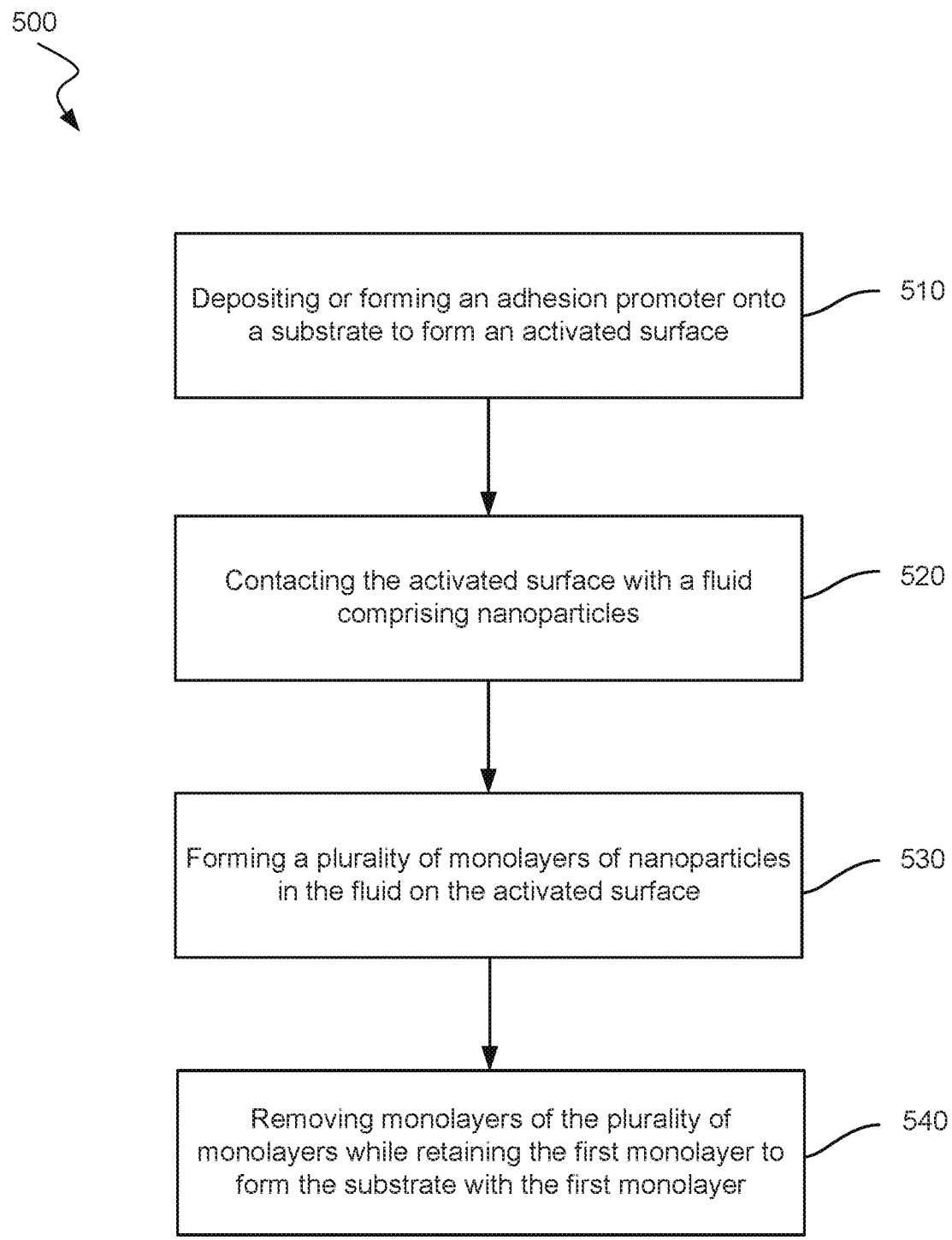
FIG. 5 shows a method of forming a monolayer of nanoparticles on a substrate according to embodiments of the present invention.

FIG. 5 shows a method 500 of forming a monolayer of nanoparticles on a substrate. The substrate may be any substrate described herein. The substrate may include a structure, which may be any structure described herein. The structure may be a three-dimensional structure. The structure may extend from the bulk of the substrate (e.g., a pillar or a fin). The substrate may define a trench or via or any other feature extending into the bulk of the substrate below the major surface of the substrate.

At block 510, method 500 includes forming an activated surface on the substrate. Forming the activated surface may include depositing an adhesion promoter onto the substrate or forming an adhesion promoter on the substrate (e.g., increasing a surface roughness of the substrate). The activated surface may be on a structure of the substrate. The activated surface may be conformal to the substrate. The activated surface may be patterned on the substrate. The activated surface may form discontinuous areas.

At block 520, method 500 includes contacting the activated surface with a fluid comprising nanoparticles. The fluid may have a wide range of pHs, but some functional groups perform best in a range of 7 to 11. The fluid comprising nanoparticles may be sprayed onto the substrate. In spraying, it is often best to choose a suspension where the fluid containing the nanoparticles does not dissolve the adhesion promoter. In some embodiments, the nanoparticles may be applied to the substrate by a spray or a dip coating process. The concentration of nanoparticles or the absolute number of nanoparticles in the liquid may be controlled so that not enough nanoparticles are available for forming monolayers above the first monolayer. The fluid may be any fluid or liquid described herein.

After contacting the activated surface with the fluid comprising nanoparticles, a subset of nanoparticles in the first monolayer is not bonded to an adjacent nanoparticle in the first monolayer. The nanoparticles of the subset may be spaced apart, similar to a stochastic arrangement. Method 500 may further include moving at least some nanoparticles of the subset of nanoparticles in the first monolayer along a surface of the substrate to form bonds between nanoparticles in the subset of nanoparticles and adjacent nanoparticles. The movement of the nanoparticles along the surface may be possible because the bond strength between the nanoparticle and the substrate or activated surface is less than a threshold value. The substrate and/or the liquid may be agitated to provide a force to move nanoparticles along the surface. The previously unbonded nanoparticles may then bond with adjacent nanoparticles.

At block 530, method 500 includes forming a plurality of monolayers of nanoparticles in the fluid on the activated surface. The plurality of monolayers of nanoparticles may include a first monolayer of nanoparticles bonded to the activated surface and a second monolayer of nanoparticles bonded to the first monolayer of nanoparticles. The bond strengths between a nanoparticle and the underlying substrate, between adjacent nanoparticles, and between nanoparticles of adjacent monolayers may have any relationship described herein. As stated above, the bonding between neighboring nanoparticles may not be a chemical bond and may instead be a result of van der Waals, coulombic, entanglement, or hydrogen bonding forces. The bond may be an association between two entities or may describe a potential energy minimum between two entities.

In some embodiments, the plurality of monolayers may include three or more monolayers, including 4, 5, 6, 7, or 8 monolayers. Monolayers may not fully cover the underlying monolayer. Monolayers may be partial or complete monolayers. Partial monolayers may be 0.5 to 0.6, 0.6 to 0.7, 0.7 to 0.8, 0.8 to 0.9, 0.9 to 0.95, or 0.95 to 0.99 complete.

At block 540, method 500 may include removing monolayers of the plurality of monolayers while retaining the first monolayer to form the substrate with the first monolayer. In some embodiments, all monolayers other than the first monolayer are removed. The method or a similar method may be repeated to form an additional monolayer on top of the first monolayer, where the first monolayer may be considered part of the substrate. In other embodiments, two, three, four, or more monolayers, including the first monolayer, remain on the substrate. Removal techniques may use a force that may remove all but the lowest one, two, three, four, or more layers by controlling the force to be less than forces holding the lowest monolayers to the substrate but greater than forces holding the upper monolayers to the lowest monolayers.

Each nanoparticle in the first monolayer may be bonded to another nanoparticle in the first monolayer (e.g., close packed). The first monolayer may not cover the whole surface of the activated surface. A structure on the substrate may be overlaid with the first monolayer. The first monolayer may conformally coat the structure on the substrate. The first monolayer may be a complete or partial monolayer. A substrate with discontinuous areas of the first monolayer may result, including when the activated surface forms discontinuous areas.

A partial monolayer may be formed by limiting the number of nanoparticles available for contacting the activated surface. The partial monolayer may be any fraction of completeness described herein. With a partial monolayer, the nanoparticles may not contact adjacent nanoparticles and may be spaced greater than a stochastic arrangement.

Removing the monolayers of the plurality of monolayers may result in a recessed portion defined by the substrate (e.g., a trench or via) having a plurality of layers of nanoparticles remaining in the recessed portion. The nanoparticles may fill 50% to 70%, 70% to 90%, 90% to 95%, 95% to 99%, or 99% to 100% of the volume of the trench or via. As some of the nanoparticles in the recessed portion could be considered part of an upper monolayer when deposited, the filling of a recessed portion may be an exception to the removal of upper monolayers across the rest of the substrate. The trench, via, recessed portion or other three-dimensional feature may be sized to be complementary to the size of the nanoparticle. For example, if only one particle is desired, the trench can be sized to be only one nanoparticle diameter deep. The filled recessed portion may perform as a waveguide or a meta material, having combined or selected properties of the substrate and the nanoparticles.

Figure 6A:
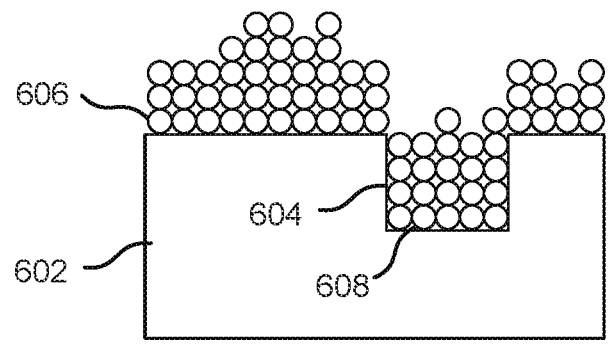
FIGS. 6A and 6B illustrate filling a trench or recessed area with nanoparticles according to embodiments of the present invention.
Figure 6B:
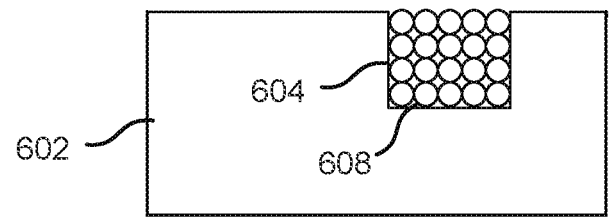

FIGS. 6A and 6B show nanoparticles in a trench feature. FIG. 6A shows a substrate 602 with a trench 604. Nanoparticles may be deposited in trench 604 and on top of substrate 602, where trench 604 is not present. Nanoparticle 606 and nanoparticle 608 are two nanoparticles that are one monolayer from substrate 602. Nanoparticle 608 is within trench 604, while nanoparticle 606 is on top of substrate 602 where trench 604 is not present. A removal technique may remove all nanoparticles from top of substrate 602. FIG. 6B shows substrate 602 after nanoparticles are removed. Nanoparticles within trench 604 may be shielded from a gas or liquid flow that removes nanoparticles not in trench 604. The force may be adjusted lower to leave a monolayer of nanoparticles present on the top of substrate 602 where trench 604 is not present. Any recessed area, including a via, may be used instead of trench 604

The upper monolayers may be removed by flowing gas substantially normal to the substrate. In some embodiments, the gas may flow in a range from 80° to 100°, 85° to 95°, 87° to 93°, 89° to 91° to the substrate. The upper monolayers may refer to any monolayer above the first monolayer. The gas may include molecular nitrogen. The gas may include an inert gas, argon, or helium.

The upper monolayers may be removed by rotating the substrate. The substrate may be rotated at a range of 500-5,000 RPM.

The upper monolayers may be removed by pulling the substrate substantially vertically out from a liquid bath so that the surface tension of the liquid removes the upper layers. Nanoparticles that are removed may be recovered and recycled for use with another substrate. The liquid bath may include water. The liquid bath may be the same fluid used for introducing the plurality of monolayers to the substrate. The substrate may have been inserted substantially vertically into the liquid bath with the nanoparticles to contact the deposited adhesion promoter with the fluid comprising nanoparticles. In some embodiments, the liquid bath is not the same fluid, and method 500 may include inserting the substrate with the plurality of monolayers into the liquid bath.

Method 500 may include adding an alcohol to the vapor space above the liquid bath. The alcohol may include isopropanol, butanol, or any alcohol with more than four carbons. The alcohol may be added to the liquid bath by introducing the butanol to the gas above the liquid bath. The alcohol in the gas may start to equilibrate with the liquid bath and may dissolve in the liquid bath. The alcohol in the liquid bath may force the meniscus that forms near the substrate farther down into the bulk of the liquid, which may help remove the upper monolayers. The substrate may be dry after removing the upper monolayers and may not undergo forced gas flow drying.

A combination of monolayer removal techniques may be used. For example, techniques may be used in series. For example, monolayers may be removed by pulling from a liquid bath and then additional monolayers may be removed using forced gas flow. In other embodiments, techniques may be used in parallel. For example, a substrate may be spun while a gas flow is directed at the substrate.

Method 500 may further include removing liquid from the substrate and the first monolayer. Removing the liquid from the substrate and the first monolayer may not include flowing a gas.

Method 500 may include removing the substrate from a chamber. Method 500 may include additional processing steps. Method 500 may include slicing the substrate into multiple devices.

II. EXAMPLE SYSTEMS

Figure 7:
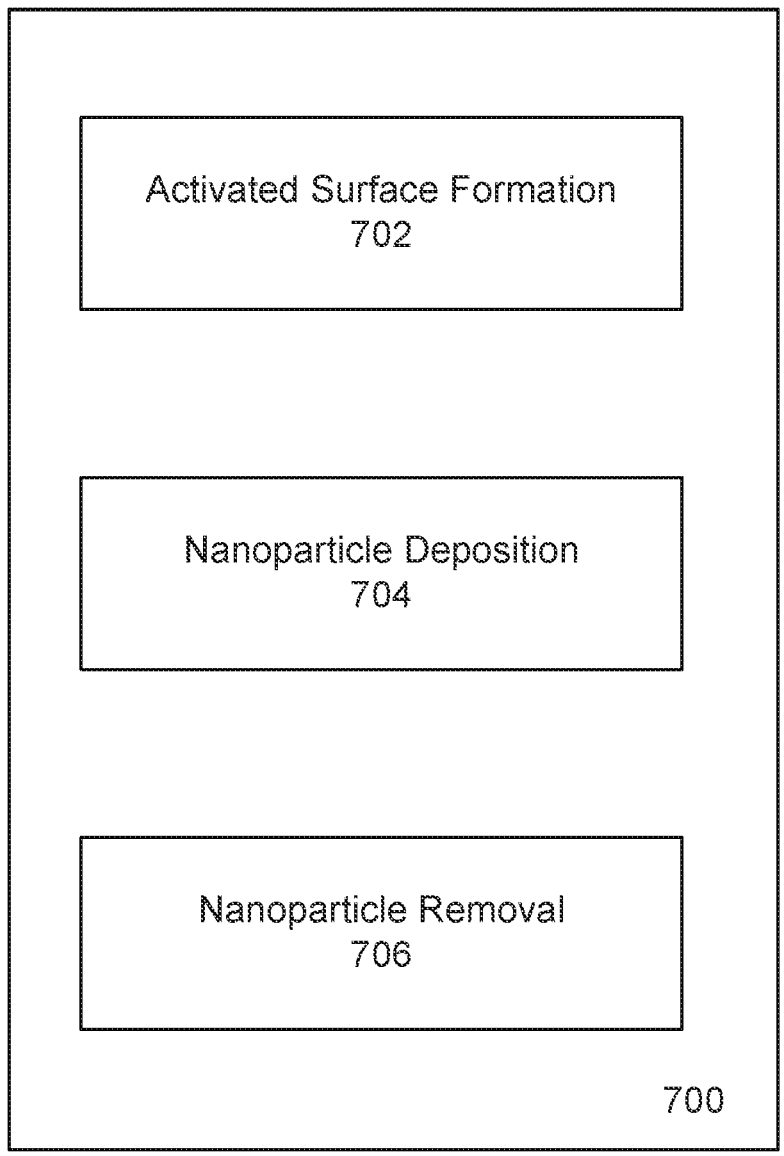
FIG. 7 shows a system for forming a monolayer of nanoparticles on a substrate according to embodiments of the present invention.

FIG. 7 shows a system 700 for depositing nanoparticles on a substrate. The system may include an activated surface formation chamber 702. The activated surface formation chamber may include an adhesion promoter deposition chamber or a chamber to roughen the surface of a substrate.

The system may include a nanoparticle deposition chamber 704. Nanoparticles may be deposited with a sprayer or a liquid bath. The system may further include a nanoparticle removal chamber 706. Nanoparticles may be removed by any system or method described herein.

The activated surface formation chamber, the nanoparticle deposition chamber, and the nanoparticle removal chamber may be integrated into a single processing system. The single processing system may be enclosed by a shell to prevent a user from interacting with the individual chambers. The single processing system may receive the substrate from a wafer container (e.g., a FOUP) and the substrate may not return to the container until after being processed through all chambers.

In other embodiments, the fluid nanoparticle deposition chamber, and the nanoparticle removal chamber may not be integrated into a single processing system. The processing system may be similar to an assembly line. The chambers may not be enclosed, and users may interact directly with each chamber. Substrates may be removed from and reintroduced to a wafer container between chambers. A roll comprising the substrate may be delivered to each chamber.

In some embodiments, the system may include a drier. The drier may dry the fluid from the substrate with a wall of gas. The drier may or may not be integrated into the same processing system as the chambers.

III. EXAMPLES

Figure 8A:
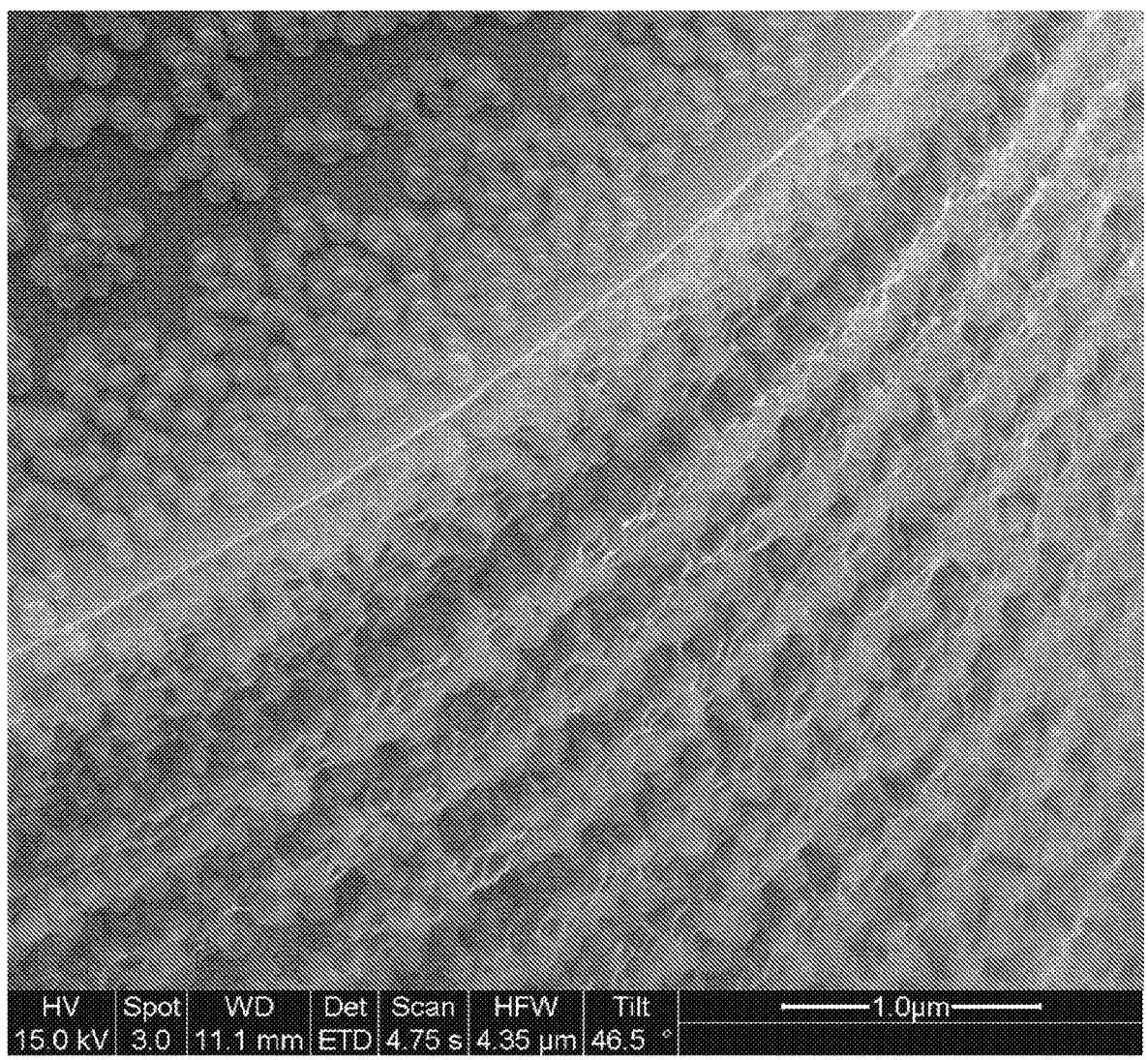
FIGS. 8A and 8B show a SEM image of a monolayer of nanoparticles on a surface according to embodiments of the present invention.
Figure 8B:
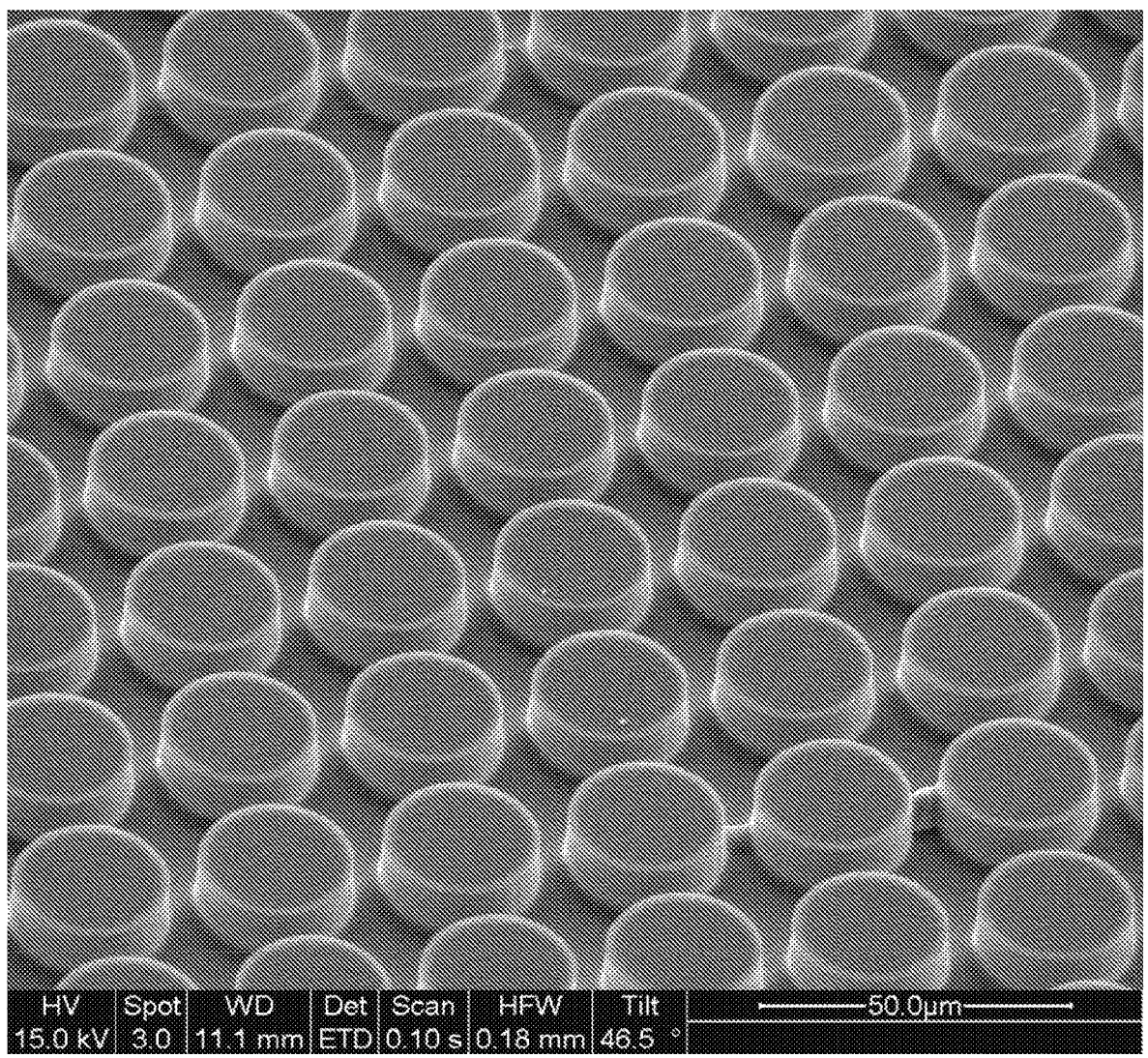

FIG. 8A shows a scanning electron microscope (SEM) image of nanoparticles on a substrate. In this exemplary case, a silicon pillar was micromachined using a standard Bosch type etching process. The Bosch process leads to scallops on the side walls where the silicon is etched prior to the deposition of sidewall passivation. The particles are found to form a near perfect monolayer both inside and outside the scalloped regions. FIG. 8B shows a zoomed out version of FIG. 8A.

Figure 9:
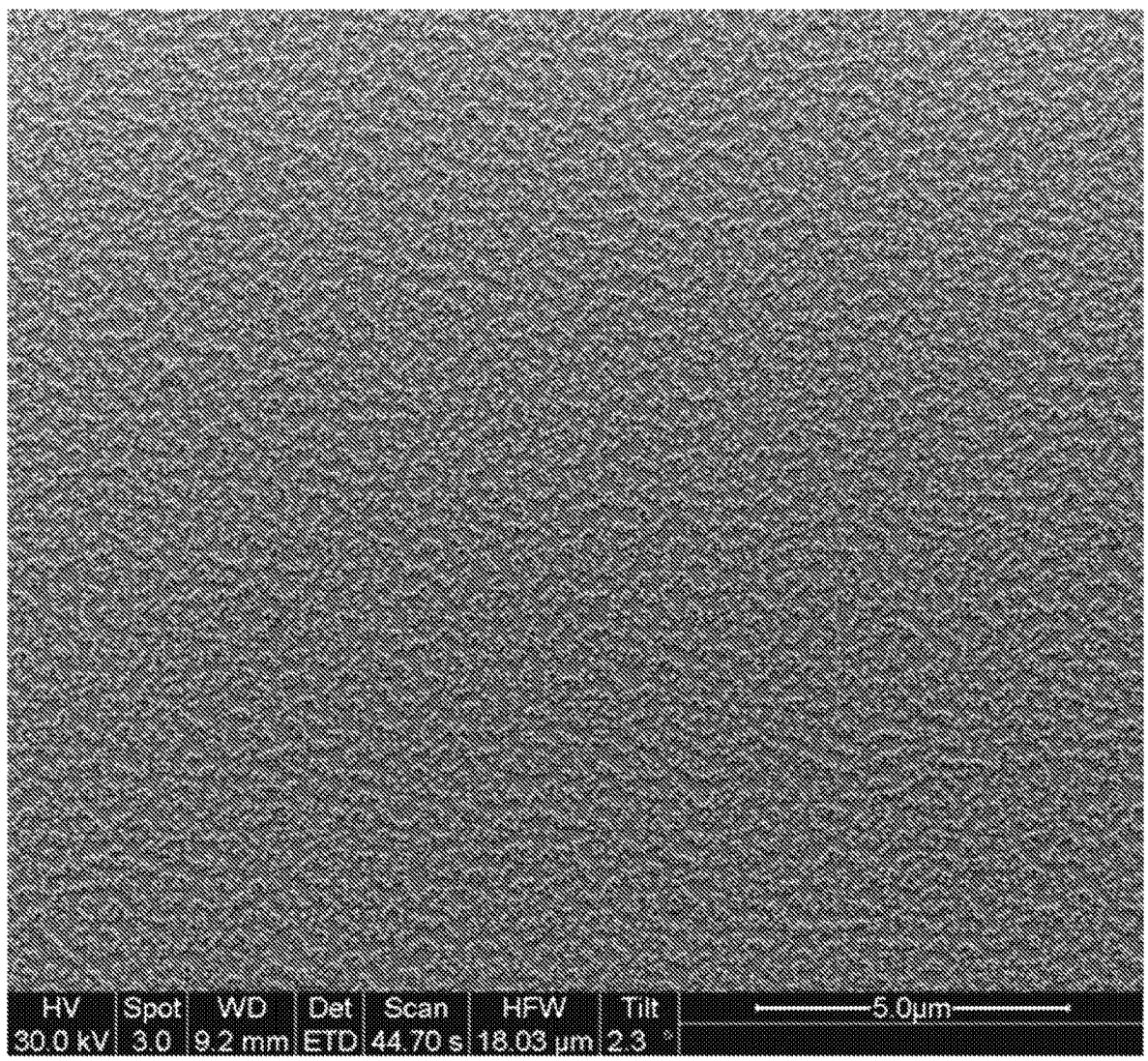
FIG. 9 shows a SEM image of nanoparticles on a substrate according to embodiments of the present invention.

FIG. 9 shows a SEM image of nanoparticles on a substrate. Nanoparticles are in a partial monolayer on the substrate. The partial monolayer resulted from a low concentration of nanoparticles available in the fluid and/or insufficient adhesion promotion.

Figure 10:
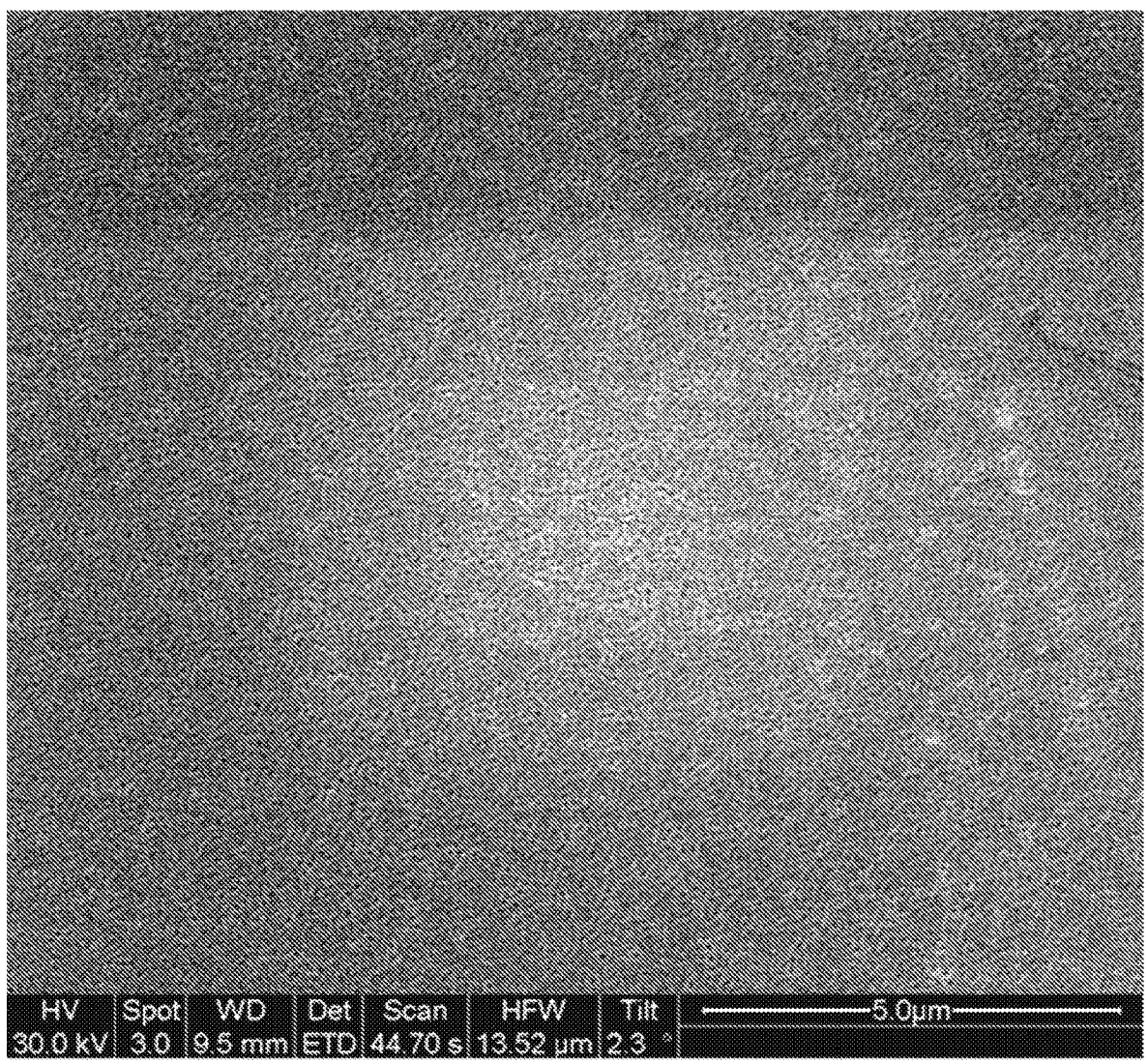
FIG. 10 shows a SEM image of nanoparticles on a substrate according to embodiments of the present invention.

FIG. 10 shows a SEM image of nanoparticles on a substrate. Nanoparticles are present in a two complete monolayers on the substrate. The complete double layer resulted from too high a concentration of nanoparticles in the fluid, insufficient pulling speed of the substrate from a liquid bath, and two high of an interaction energy between nanoparticles.

Figure 11:
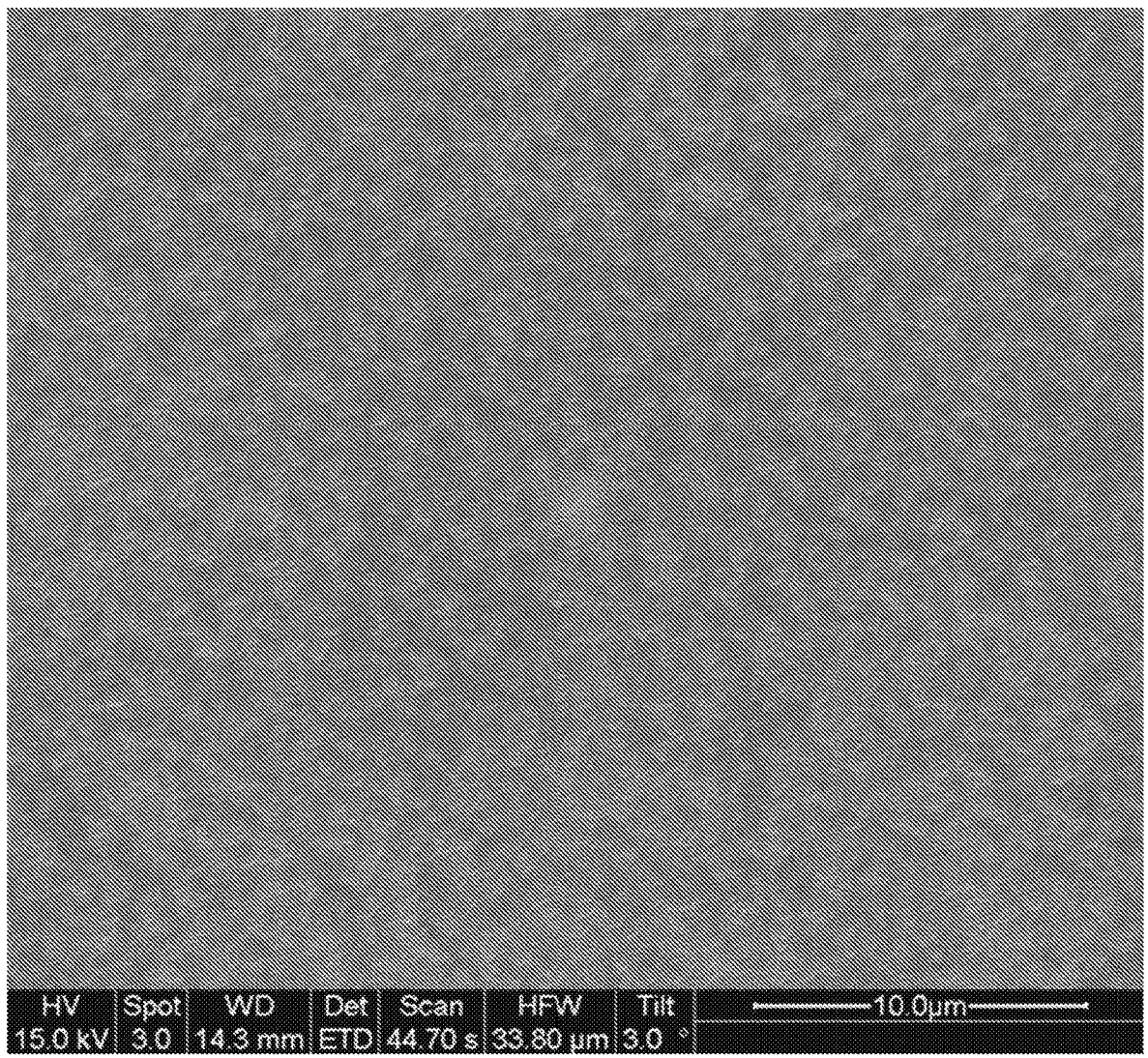
FIG. 11 shows a SEM image of nanoparticles on a substrate according to embodiments of the present invention.

FIG. 11 shows a SEM image of nanoparticles on a substrate. Nanoparticles are present in a complete monolayer.

Figure 12A:
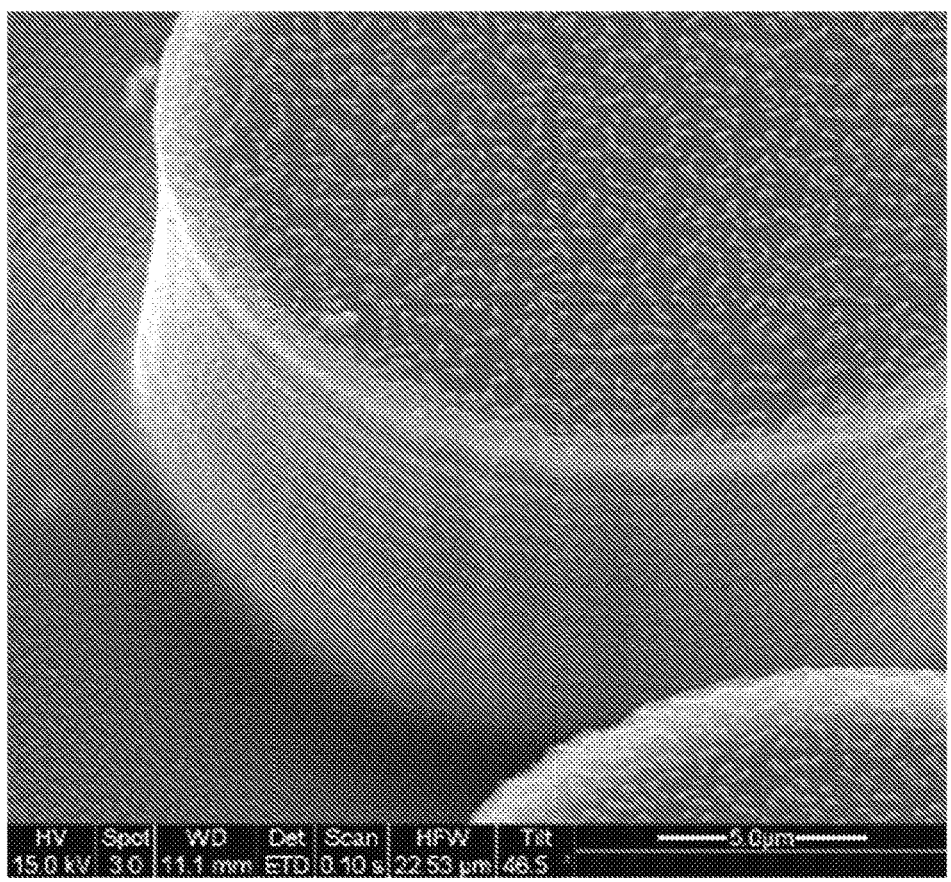
FIGS. 12A and 12B show a SEM image of nanoparticles on a substrate according to embodiments of the present invention.
Figure 12B:
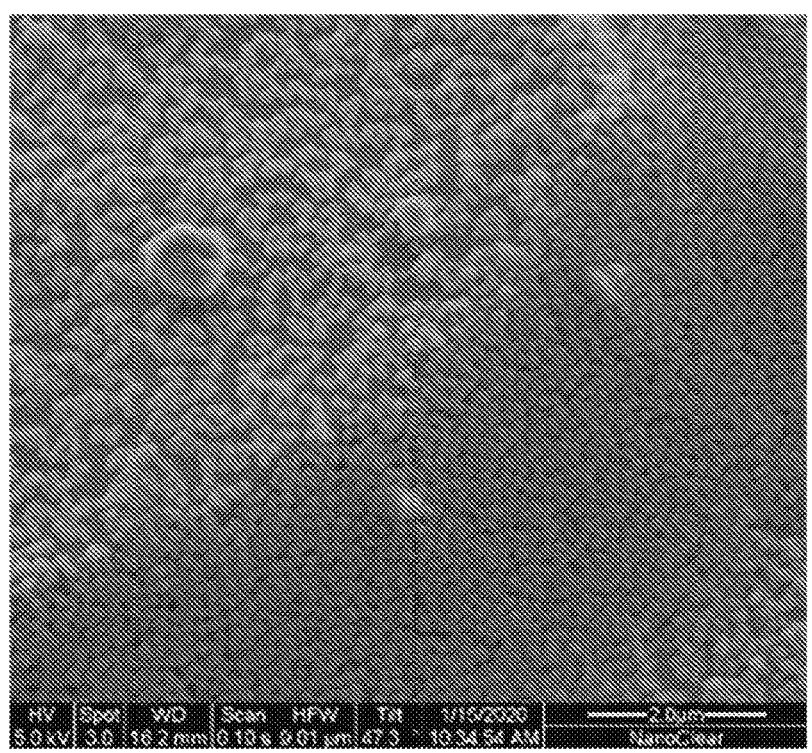

FIGS. 12A and 12B show SEM images of nanoparticles on a three-dimensional structure. FIG. 12A shows the deposition of nanoparticles on the edges and top of a cylindrical pillar. FIG. 12B shows a zoomed in view of the edge of the pillar and the top of the pillar. A more complete monolayer is present on the edge of the pillar compared to the top of the pillar.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the nanoparticle" includes reference to one or more nanoparticles and equivalents thereof known to those skilled in the art, and so forth. The invention has now been described in detail for the purposes of clarity and understanding. However, it will be appreciated that certain changes and modifications may be practice within the scope of the appended claims.

"Substantially" may refer to a degree of less than completely or perfectly. For example, "substantially" may refer to something that is within 10%, 5%, or 1% of some target characteristic.

All publications, patents, and patent applications cited herein are hereby incorporated by reference in their entirety for all purposes. None is admitted to be prior art.

What is claimed is:

1. A method of forming a monolayer of nanoparticles, the method comprising:
   forming an activated surface on a substrate;
   contacting the activated surface with a fluid comprising nanoparticles;
   forming a plurality of monolayers of nanoparticles in the fluid on the activated surface, the plurality of monolayers of nanoparticles comprising a first monolayer of nanoparticles bonded to the activated surface and a second monolayer of nanoparticles bonded to the first monolayer of nanoparticles, wherein:

a first bond between a first nanoparticle of the first monolayer and the activated surface is characterized by a first bond strength, the first bond does not comprise a covalent bond, a second bond between two adjacent nanoparticles of the first monolayer is characterized by a second bond strength, a third bond between the first nanoparticle of the first monolayer and an adjacent nanoparticle of the second monolayer is characterized by a third bond strength, the first bond strength is greater than the second bond strength, the second bond strength is greater than the third bond strength, and the first bond strength is less than a threshold value; and removing monolayers of the plurality of monolayers while retaining the first monolayer to form the substrate with the first monolayer, wherein each nanoparticle in the first monolayer is bonded to another nanoparticle in the first monolayer.

2. The method of claim 1, wherein forming the activated surface comprises depositing an adhesion promoter or increasing a surface roughness of the substrate.

3. The method of claim 1, wherein the first monolayer is a complete monolayer.

4. The method of claim 1, wherein:
after contacting the activated surface with the fluid comprising nanoparticles, a subset of nanoparticles in the first monolayer is not bonded to an adjacent nanoparticle in the first monolayer,
the method further comprising:
moving at least some nanoparticles of the subset of nanoparticles in the first monolayer along a surface of the substrate to form bonds between nanoparticles in the subset of nanoparticles and adjacent nanoparticles.

5. The method of claim 1, wherein the plurality of monolayers comprises three or more monolayers.

6. The method of claim 1, wherein removing the monolayers of the plurality of monolayers comprises flowing gas substantially normal to the substrate.

7. The method of claim 1, wherein removing the monolayers of the plurality of monolayers comprises rotating the substrate.

8. The method of claim 1, wherein removing the monolayers of the plurality of monolayers comprises:
pulling the substrate substantially vertically out from a liquid bath so that the surface tension of the liquid bath removes the monolayers of the plurality of monolayers except for the first monolayer from the substrate.

9. The method of claim 8, wherein:
the liquid bath comprises nanoparticles and the fluid, and
contacting the activated surface with the fluid comprising nanoparticles comprises inserting the substrate substantially vertically into the liquid bath.

10. The method of claim 8, further comprising adding an alcohol to a vapor space above the liquid bath.

11. The method of claim 1, wherein:
the substrate comprises a structure,
the structure extends from a bulk of the substrate,
the activated surface is on the structure, and
removing the monolayers of the plurality of monolayers forms the structure overlaid with the first monolayer.

12. The method of claim 1, wherein:
the substrate defines a recessed portion,
removing the monolayers of the plurality of monolayers forms the recessed portion having a plurality of layers of nanoparticles within the recessed portion.

13. The method of claim 1, wherein:
forming the activated surface forms discontinuous areas of the activated surface,
removing the monolayers results in the substrate with discontinuous areas of the first monolayer.

14. The method of claim 1, further comprising removing the fluid from the substrate and the first monolayer.

15. The method of claim 14, wherein removing the fluid from the substrate and the first monolayer does not comprise flowing a gas.

16. The method of claim 1, wherein contacting the activated surface with the fluid comprising nanoparticles comprises spraying the fluid comprising nanoparticles at the substrate.

17. The method of claim 1, wherein after removing monolayers of the plurality of monolayers, the first monolayer is the only monolayer of nanoparticles on the substrate.

18. The method of claim 17, further comprising repeating the method of forming the first monolayer to form an additional monolayer on the first monolayer.

19. The method of claim 1, wherein the fluid is a liquid.

20. The method of claim 1, wherein the threshold value is 500 kJ/mole.

* * * * *